United States Patent [19]
Hu

[11] Patent Number: 6,100,185
[45] Date of Patent: *Aug. 8, 2000

[54] SEMICONDUCTOR PROCESSING METHOD OF FORMING A HIGH PURITY <200> GRAIN ORIENTATION TIN LAYER AND SEMICONDUCTOR PROCESSING METHOD OF FORMING A CONDUCTIVE INTERCONNECT LINE

[75] Inventor: Yongjun Jeff Hu, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/134,624

[22] Filed: Aug. 14, 1998

[51] Int. Cl.$^7$ .................................................. H01L 21/4763
[52] U.S. Cl. .......................... 438/642; 438/626; 438/632; 438/635; 438/672
[58] Field of Search ..................................... 438/396, 626, 438/632, 635, 642, 672

[56] References Cited

U.S. PATENT DOCUMENTS

| | | | |
|---|---|---|---|
| 4,746,219 | 5/1988 | Holloway et al. | 357/23.11 |
| 4,863,559 | 9/1989 | Douglas | 156/643 |
| 4,994,402 | 2/1991 | Chiu | 437/41 |
| 5,032,233 | 7/1991 | Yu et al. | 204/192.48 |
| 5,043,300 | 8/1991 | Nulman | 437/200 |
| 5,084,406 | 1/1992 | Rhodes et al. | 437/52 |

(List continued on next page.)

FOREIGN PATENT DOCUMENTS

| | | |
|---|---|---|
| 0 631 309 A2 | 12/1994 | European Pat. Off. . |
| 0 631 309 A3 | 12/1994 | European Pat. Off. . |
| 6-010673 | 1/1994 | Japan . |

OTHER PUBLICATIONS

U.S. application no. 09/026,104, Hu, filed Feb. 19, 1998.

Byun, Jeong Soo et al., "Formation Of a Large Grain Sized TiN Layer Using $TiN_x$, The Epitaxial Continuity At The Al/TiN Interface . . . ", *J. Appl. Phys.*, 78(3), pp. 1719–1724 (Aug. 1995).

Byun, Jeong Soo, "Epitaxial C49–$TiSi_2$ Formation On (100)Si Substrate Using $TiN_x$, And Its Electrical Characteristics As a Shallow Contact Metallization", *J. Electrochem. Soc.*, vol. 143, No. 6, pp. 1984–1991 (Jun. 1996).

Byun, Jeong Soo et al., "Expitaxial $TiSi_2$ Growth On Si(100) From Reactive Sputtered $TiN_2$ And Subsequent Annealing", *Materials Research Soc. Proceedings*, Pittsburgh, vol. 355, pp. 465–470 (1995).

Byun, Jeong Soo, et al., "W As A Bit Line Interconnection In Capacitor–Over–Bit–Line (COB) Structured Dynamic Random Access Memory (DRAM) and Feasible Diffusion Barrier Layer", *J. Appl. Phys.*, vol. 35, pp. 1086–1089 (1996).

(List continued on next page.)

*Primary Examiner*—David Nelms
*Assistant Examiner*—Reneé R. Berry
*Attorney, Agent, or Firm*—Wells, St. John, Roberts, Gregory & Matkin P.S.

[57] ABSTRACT

Conductive structures, conductive lines, conductive SRAM lines, integrated circuitry, SRAM cells, and methods of forming the same are described. In one embodiment, a substrate is provided and a layer comprising TiN is physical vapor deposited over the substrate having greater than or equal to about 90% by volume <200> grain orientation. In another embodiment, at least two components are electrically connected by forming a layer of TiN over a substrate having the desired by-volume concentration of <200> grain orientation, and etching the layer to form a conductive line. In a preferred embodiment, conductive lines formed in accordance with the invention electrically connect at least two SRAM components and preferably form cross-coupling electrical interconnections between first and second inverters of an SRAM cell.

4 Claims, 5 Drawing Sheets

U.S. PATENT DOCUMENTS

| | | | |
|---|---|---|---|
| 5,094,977 | 3/1992 | Yu et al. | 437/174 |
| 5,147,819 | 9/1992 | Yu et al. | 437/173 |
| 5,187,122 | 2/1993 | Bonis | 437/200 |
| 5,196,360 | 3/1993 | Doan et al. | 437/41 |
| 5,236,865 | 8/1993 | Sandhu et al. | 437/174 |
| 5,278,098 | 1/1994 | Wei et al. | 437/192 |
| 5,296,404 | 3/1994 | Akabori et al. | 437/173 |
| 5,326,404 | 7/1994 | Sato | 118/723 |
| 5,341,016 | 8/1994 | Prall et al. | 257/412 |
| 5,378,641 | 1/1995 | Cheffings | 437/35 |
| 5,391,520 | 2/1995 | Chen et al. | 437/200 |
| 5,480,814 | 1/1996 | Wuu et al. | 437/41 |
| 5,589,417 | 12/1996 | Jeng | 437/190 |
| 5,593,511 | 1/1997 | Foster et al. | 148/238 |
| 5,627,102 | 5/1997 | Shinriki et al. | 438/648 |
| 5,654,235 | 8/1997 | Matsumoto et al. | 438/643 |
| 5,683,930 | 11/1997 | Batra et al. | 437/60 |
| 5,766,997 | 6/1998 | Takeuchi | 438/257 |
| 5,776,831 | 12/1995 | Padmanabhan et al. | 438/653 |
| 5,783,478 | 7/1998 | Chau et al. | 438/592 |
| 5,925,225 | 7/1999 | Ngan et al. | 204/192.17 |

OTHER PUBLICATIONS

Byun, Jeong Soo, et al., "TiN/TiSi$_2$ Formation Using TiN$_x$ Layer And Its Feasibilities In ULSI", *Jpn. J. Appl. Phys.*, vol. 35, pp. 982–986 (1995).

Murakami, Shigeru, et al., "Plasma–Nitridated Ti Contact System For VLSI Interconnections", *I.E.E.E., Multilevel VLSI Interconnection Conference*, IEEE Catalog No. 87CH2488–5, pp. 148–154, (Jun. 1987).

6,100,185

SEMICONDUCTOR PROCESSING METHOD OF FORMING A HIGH PURITY <200> GRAIN ORIENTATION TIN LAYER AND SEMICONDUCTOR PROCESSING METHOD OF FORMING A CONDUCTIVE INTERCONNECT LINE

TECHNICAL FIELD

This invention pertains to semiconductor processing methods of forming conductive structures, to methods of forming conductive lines, to methods of forming conductive SRAM lines, and to related integrated circuitry and SRAM cells.

BACKGROUND OF THE INVENTION

Semiconductor fabrication typically involves forming a large number of electrical devices over a substrate. Typically, many of these devices are electrically interconnected with conductive lines. Conductive lines can comprise two or more conductive components such as, for example, titanium nitride (TiN) and polysilicon or a silicide. Such conductive lines are typically formed by blanket depositing conductive material over the substrate and subsequently patterning and etching the conductive material into desired conductive lines.

As device dimensions continue to shrink, etching conductive lines can become problematic due to the undercutting of some of the conductive material from which these lines are formed. For example, FIG. 1 shows a semiconductor wafer fragment generally at 10 which includes a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A field oxide region 14 is provided atop which an etched conductive line is disposed generally at 16. Conductive line 16 includes a first conductive material layer 18 and a second conductive material layer 20. Exemplary materials are titanium nitride (first layer 18) and tungsten silicide or polysilicon (second layer 20). These specific materials can be anisotropically etched through the use of an etch chemistry which includes a mixture of NH$_4$OH and a peroxide (H$_2$O$_2$). Doing so, however, can cause layer 18 to be undercut such that conductive line 16 does not have substantially vertical sidewalls. Undercutting can be a significant problem as device dimensions shrink and hence, the portion of material removed by the undercut increases in proportion to the total conductive line material. A major factor associated with the undercutting of layer 18 has been found to be a mixture of <111> and <200> grain orientations within the layer.

This invention arose out of concerns associated with providing improved methods of forming conductive structures, and in particular, conductive interconnect lines. This invention also arose out of concerns associated with providing improved semiconductor devices such as memory devices, and specifically, SRAM cells.

BRIEF DESCRIPTION OF THE DRAWINGS

Preferred embodiments of the invention are described below with reference to the following accompanying drawings.

SUMMARY OF THE INVENTION

Conductive structures, conductive lines, conductive SRAM lines, integrated circuitry, SRAM cells, and methods of forming the same are described. In one embodiment, a substrate is provided and a layer comprising TiN is physical vapor deposited over the substrate having greater than or equal to about 90% by volume <200> grain orientation. In another embodiment, at least two components are electrically connected by forming a layer of TiN over a substrate having the desired by-volume concentration of <200> grain orientation, and etching the layer to form a conductive line. In a preferred embodiment, conductive lines formed in accordance with the invention electrically connect at least two SRAM components and preferably form cross-coupling electrical interconnections between first and second inverters of an SRAM cell.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
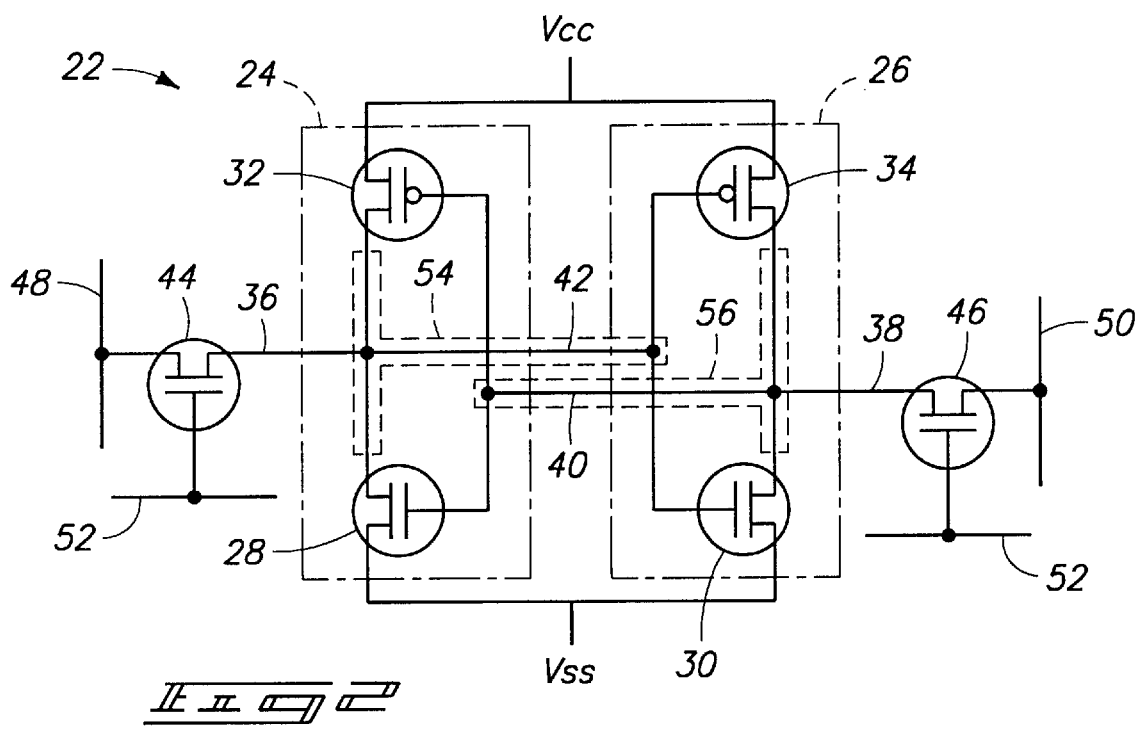
FIG. 2 is a schematic view of an SRAM cell in accordance with one embodiment of the present invention.

Referring to FIG. 2, integrated circuitry in accordance with one embodiment of the present invention is shown generally at 22 and comprises a static read/write memory cell such as is typically used in high-density static random access memories (SRAMs).

A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

Integrated circuitry 22 generally includes first and second inverters 24, 26 which are cross-coupled to form a bistable flip-flop. Inverters 24, 26 can be formed by n-channel driver transistors 28 and 30, and p-channel load transistors 32, 34. Driver transistors 28, 30 are typically n-channel metal oxide silicon field effect transistors (MOSFETs) formed in an underlying silicon semiconductor substrate. P-channel transistors 32, 34 are typically thin film transistors formed above the driver transistors. Other SRAM constructions, e.g. CMOS SRAM cells, are of course possible.

The source regions of driver transistors 28, 30 are tied to a low reference or circuit supply voltage labelled $V_{SS}$ and typically referred to as "ground." Load transistors 32, 34 are connected in series between a high reference or circuit supply voltage labelled $V_{CC}$, and the drains of the corresponding drive transistors 28, 30. The gates of load transistors 32, 34 are respectively connected to the gates of corresponding drive transistors 28, 30.

Inverter 24 has an inverter output 36 formed by the drain of driver transistor 28. Similarly, inverter 26 has an inverter output 38 formed by the drain of driver transistor 30. Inverter 24 has an inverter input 40 formed by the gate of driver transistor 28. Inverter 26 has an inverter input 42 formed by the gate of driver transistor 30.

The inputs and outputs of inverters 24, 26 are cross-coupled by an electrical interconnection which electrically connects the inverters to form a flip-flop having a pair of complementary, two-state outputs. Specifically, inverter output 26 is cross-coupled to inverter input 42, and inverter output 38 is cross-coupled to inverter input 40. In this configuration, inverter outputs 36 and 38 form the complementary two-state outputs of the flip-flop.

A memory flip-flop such as that described above typically forms one memory element of an integrated array of static memory elements. A plurality of access transistors, such as access transistors 44 and 46, are used to selectively address and access individual memory elements within the array. Access transistor 44 has one active terminal connected to cross-coupled inverter output 36. Access transistor 46 has one active terminal connected to cross-coupled inverter output 38. A plurality of complementary column line pairs, such as the single pair of complementary column lines 48 and 50, are connected to the remaining active terminals of access transistors 44, 46 respectively. A row line 52 is connected to the gates of access transistors 44, 46.

Reading static memory cell 22 involves activating row line 52 to connect inverter outputs 36, 38 to column lines 48, 50 respectively. Writing to static memory cell 22 involves placing selected complementary logic voltages on column lines 48, 50 and then activating row line 52 to connect those logic voltages to inverter outputs 36, 38. This forces the outputs to the selected logic voltages, which will be maintained as long as power is supplied to the memory cell, or until the memory cell is reprogrammed.

The illustrated SRAM cell comprises a six-transistor cell in which at least one, and preferably more of the transistors comprise MOSFETs. In the illustrated example, all of the transistors comprise MOSFETs. It is possible, however, for less than all of the transistors to comprise MOSFETs, and for less than six transistors to comprise the memory cell. For example, memory cells can be provided to have four or less transistors. Exemplary constructions are disclosed in U.S. Pat. No. 5,683,930, the disclosure of which is incorporated by reference.

Regardless of whether an SRAM cell contains six or less transistors, or whether those transistors are MOSFETs or other types of transistors or load devices, one aspect of the invention provides an interconnective network of conductive lines connecting the transistors or devices into an SRAM configuration wherein at least one of the conductive lines of the network comprises a TiN layer having a greater than or equal to about 90% by volume <200> grain orientation. An exemplary interconnective network is shown in FIG. 2 to comprise conductive lines which are respectively bounded by the dashed lines 54, 56.

Figure 3:
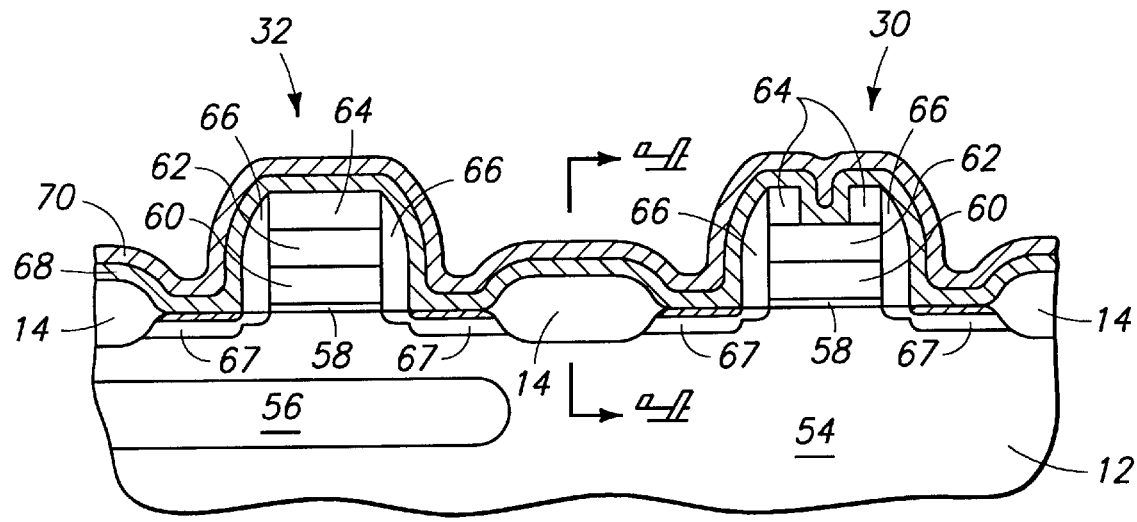
FIG. 3 is a diagrammatic sectional view of a portion of the FIG. 2 SRAM cell undergoing processing in accordance with one embodiment of the present invention.

Referring to FIG. 3, an exemplary portion of the FIG. 2 integrated circuitry is shown. Device components or transistors 30, 32 are supported over substrate 12 which includes a p-well 54 and an n-well 56. Each transistor typically includes a gate oxide layer 58, a polysilicon layer 60, a silicide layer 62, and an insulative cap 64. Sidewall spacers 66 are provided over layers 60, 62 and 64. Other transistor constructions are, of course, possible. In the illustrated example, transistor 30 comprises a first transistor having a gate and diffusion regions 67 associated therewith. Transistor 32 comprises a second transistor having a gate and diffusion regions 67 associated therewith. In the illustrated example, diffusion regions 67 comprise an uppermost silicide portion which is not specifically designated. A portion of the insulative cap of transistor 30 has been removed to expose conductive portions of silicide layer 62 thereunder. A layer 68 comprising TiN is physical vapor deposited over the substrate under conditions which are effective to provide a greater than or equal to about 90% by volume <200> grain orientation. In a preferred embodiment, layer 68 is deposited under conditions which provide both <200> and <111> grain orientations, with there being more <200> grain orientations than <111> grain orientations. Even more preferably, layer 68 is deposited to have both grain orientations in a ratio of <200>:<111> of at least about 99:1.

Layer 68 is preferably blanket deposited over desired portions of substrate 12 and a conductive layer 70 is formed over layer 68. Exemplary materials for layer 70 include silicide or polysilicon, with the former being preferred. Layers 68, 70 collectively form an electrically conductive interconnection between the gate of transistor 30 and both of diffusion regions 67 of transistor 32. This is, of course, prior to patterning the deposited layers into the desired interconnective network of conductive lines which, in this example, provide the cross-coupling electrical connections.

Figure 4:
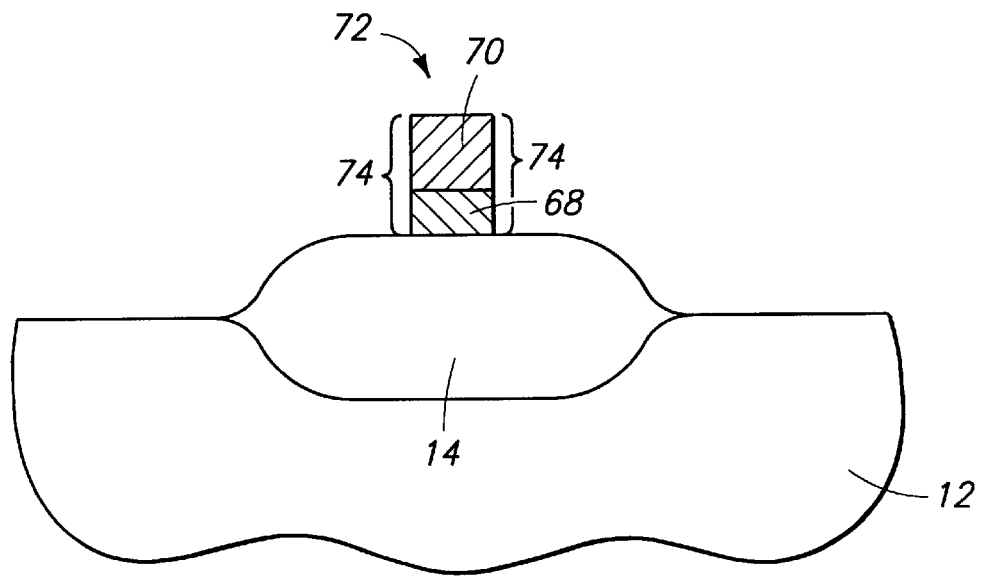
FIG. 4 is a diagrammatic side sectional view of a conductive structure which is formed in accordance with one embodiment of the present invention.

Referring to FIG. 4, layers 68, 70 are patterned and etched, preferably anisotropically, sufficiently to form a conductive line 72 electrically connecting at least two and preferably more of the SRAM device components. Exemplary conductive lines are enclosed by the dashed lines 54, 56 in FIG. 2. Layer 70 is preferably anisotropically dry etched by $NF_3$. Etching of layer 68 is preferably conducted using a mixture of $NH_4OH$ and a peroxide. For instance, a 4:1:1 mixture of $H_2O:H_2O_2:NH_4OH$ at 65° C. for 50 seconds can be utilized. Conductive line 72 is formed to have substantially vertical conductive line sidewalls 74 which comprise material of both layers 68, 70. Conductive line 72 also has an average silicide layer width at least as great as an average TiN layer width, owing to the fact that little, if any undercut occurs due to the desired presence of the <200> grain orientation in layer 68.

Figure 5:
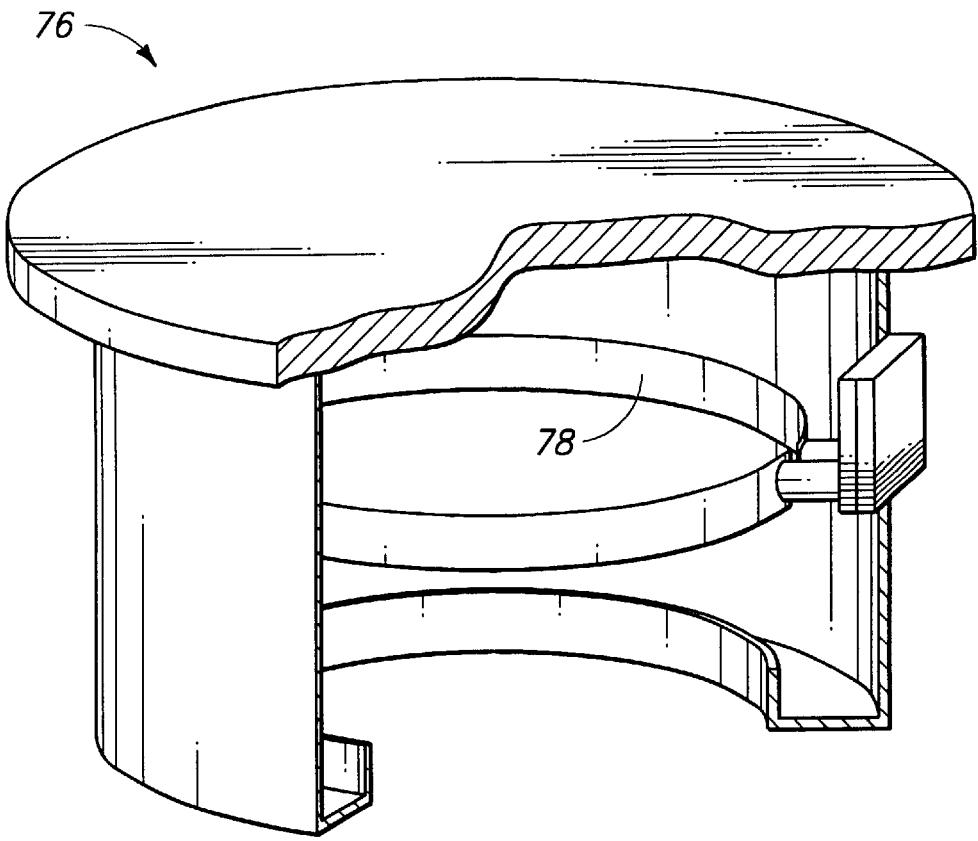
FIG. 5 is a perspective view of a processing reactor, with a portion broken away for clarity, in accordance with one preferred embodiment of the present invention.
Figure 6:
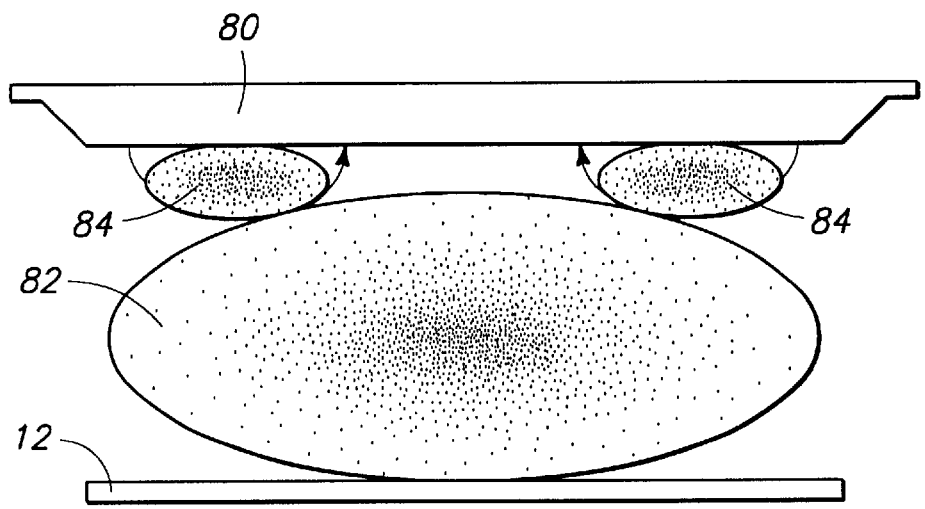
FIG. 6 is an elevational schematic view of one aspect of processing in accordance with a preferred embodiment of the invention.

Referring to FIGS. 5 and 6, a reduction-to-practice example is described wherein a sputtering reactor 76 having an inductive coil 78 mounted therewithin was utilized to ionize titanium sputtered from a titanium target 80 through a gas plasma 82 developed by the inductive coil 78. The inductive coil can be powered with RF power from between about 1–6 kw. More preferably, RF power can be provided from between about 2.5–3.5 kw. The RF frequency is preferably varied between 1.8 to 2.2 MHz. A magnetron plasma 84 is also shown near the target for sputtering metal. In a preferred embodiment, an Applied Materials Ion Metal Plasma (IMP) reactor was utilized to deposit the desired titanium nitride-comprising layer. In such reactor, sputtered metal is ionized by passing it through a medium density plasma, e.g. $10^{11}/cm^3$ to $10^{12}/cm^3$, generated in the deposition chamber between the target and the wafer. A high electric field or self-bias develops in the boundary layer or sheath between the plasma and the substrate which accelerates the metal ions toward the substrate in a vector generally perpendicular to the wafer surface. In this example, the gas plasma which is generated within the reactor extends entirely between at least a portion of the target and a portion of the substrate.

In the reduction-to-practice example, a substrate was placed within the sputtering reactor having a titanium target positioned therein. A nitrogen source gas ($N_2$) was flowed into the reactor at a flow rate from between about 15–100 sccm, and preferably around 40 sccm. The nitrogen source gas was flowed together with argon at an argon flow rate from between about 15–150 sccm, and preferably around 30 sccm. The substrate was provided at a temperature of less than about 450° C. and preferably around 300° C. Pressure was maintained at between 4 to 40 mTorr, and preferably between 20 to 30 mTorr. Target power was provided from between about two to three kilowatts, with a substrate bias of no greater than about 30 volts.

Figure 1:
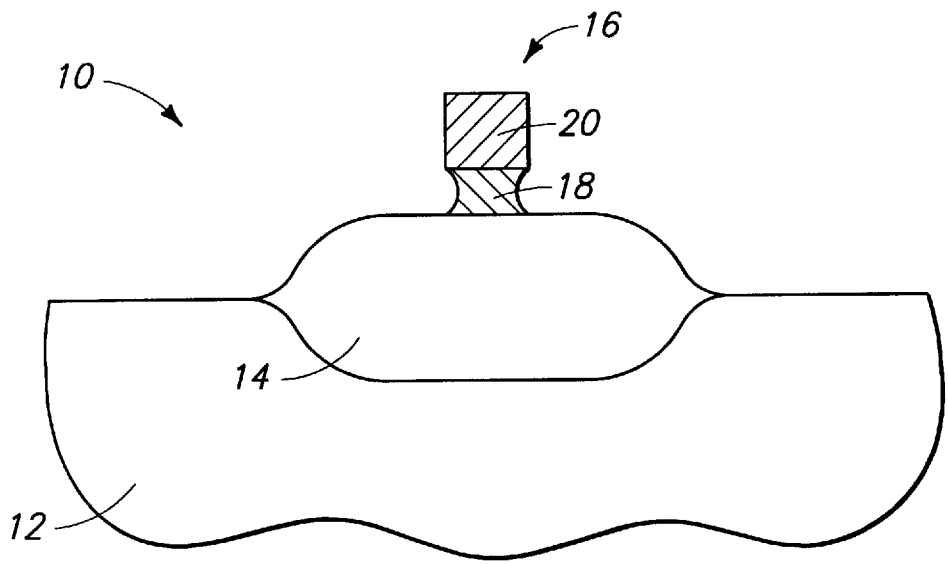
FIG. 1 is a diagrammatic side sectional view of a semiconductor wafer fragment in process in accordance with the prior art.
Figure 7:
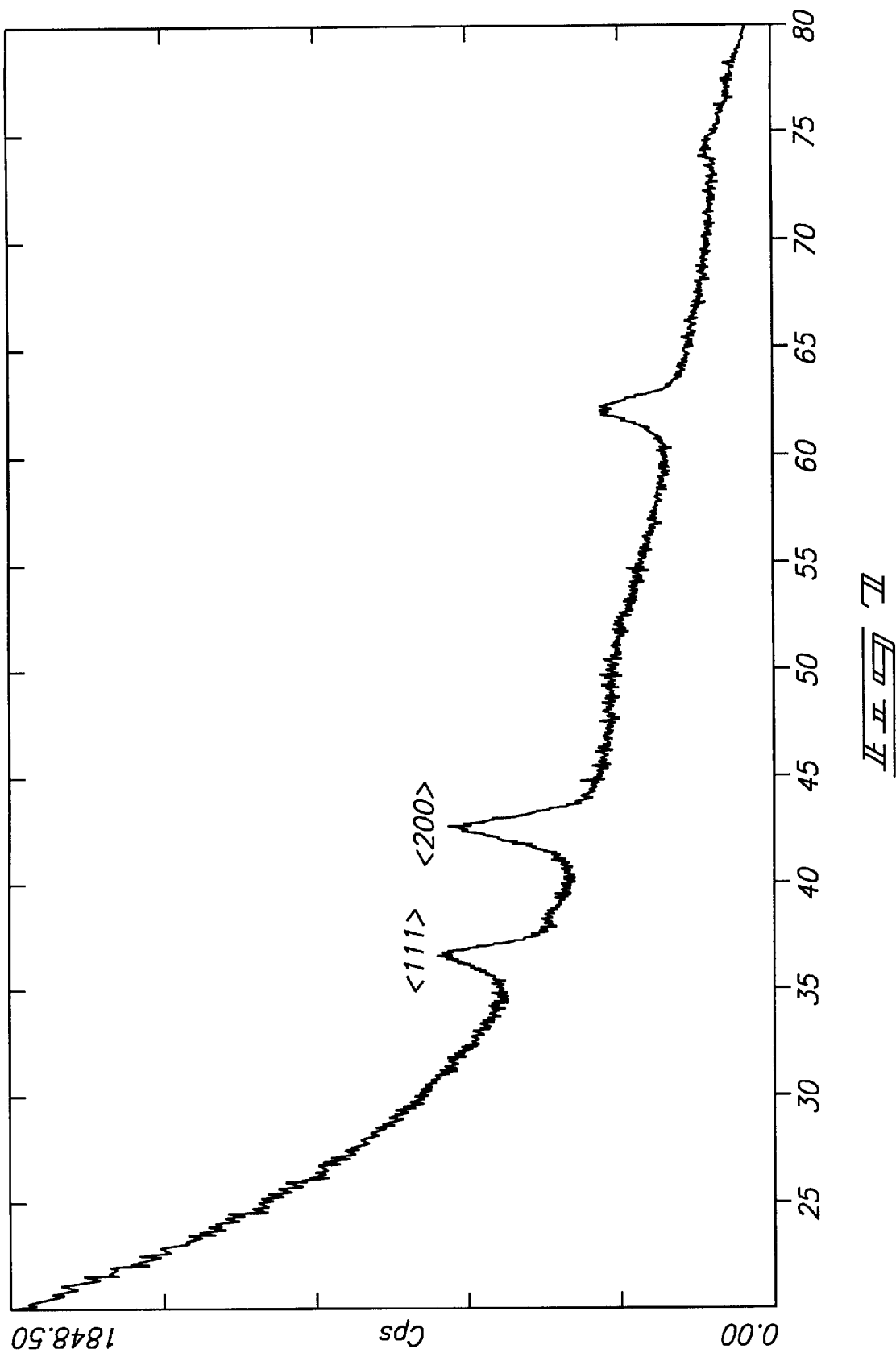
FIG. 7 is a graph of x-ray diffraction data developed in accordance with a conductive line such as that shown in FIG. 1.
Figure 8B:
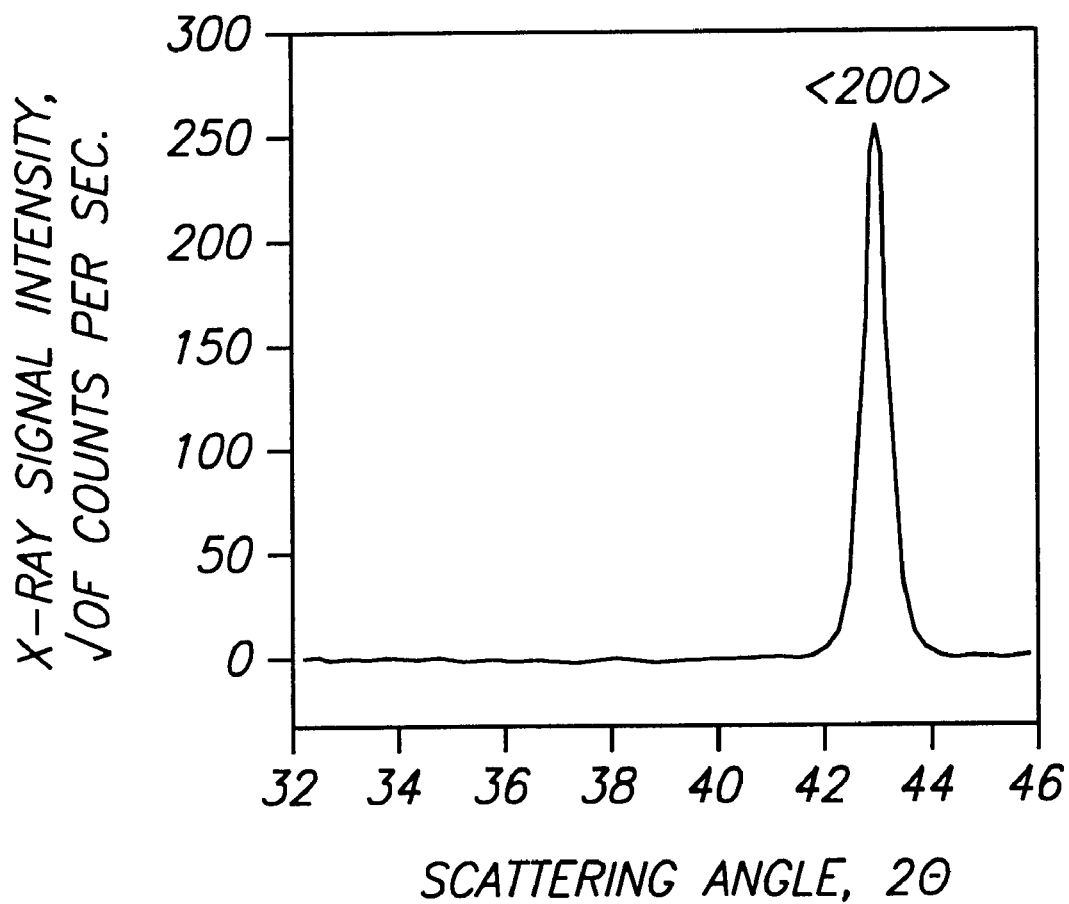
FIG. 8 is a graph of x-ray diffraction data developed in accordance with a conductive line such as that shown in FIG. 4.

Referring to FIGS. 7 and 8, x-ray diffraction studies were conducted to confirm the presence of the <200> grain orientations in the deposited layer. FIG. 7 shows a study conducted utilizing a deposited material such as that comprising conductive line 16 (FIG. 1). There, study results confirm the presence of a mixture of <111> and <200> grain orientations. On the other hand, utilizing the above-described methods, a titanium nitride layer was deposited having the x-ray diffraction profile shown in FIG. 8. This profile confirms the presence of <200> grain orientation (or a single-phase material) in the desired quantities sufficient to yield etched conductive structures such as that described above in connection with FIG. 4.

The above-described methods can markedly reduce TiN undercut. The inventive methods can be implemented in connection with current processing flows, even when design rules are pushed to 0.2-micron and beyond, e.g. conductive lines having widths no greater than about 0.2-micron.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a conductive interconnect line comprising:

providing a semiconductive substrate having at least two components between which electrical communication is desired;

positioning the semiconductive substrate within a chamber of a physical vapor deposition reactor, the reactor having an inductive coil received within the chamber in which the semiconductive substrate is positioned, the chamber including a titanium target opposite which the semiconductive substrate is received, the inductive coil being received intermediate the target and substrate proximate a radial periphery of the chamber;

injecting a sputtering gas and a nitrogen containing source gas to within the chamber while generating a sputtering magnetron plasma proximate the titanium target and a gas plasma with the inductive coil proximate the semiconductive substrate, the magnetron and gas plasmas collectively extending entirely between at least a portion of the target and a portion of the semiconductive substrate, the inductive coil being powered at from about 1 kw to about 6 kw and the substrate being at less than 450° C. during at least some of the injecting effective to deposit a TiN comprising layer having at least 99% <200> crystal grain orientation purity;

removing the semiconductive substrate from the chamber and depositing a conductive layer over the TiN comprising layer having at least 99% <200> crystal grain orientation purity;

first anisotropically etching the conductive layer into an interconnect line shape using a first etching chemistry; and second anisotropically etching the TiN comprising layer having at least 99% <200> crystal grain orientation purity into the interconnect line shape using a second chemistry different from the first to produce an interconnect line of both the conductive and TiN comprising layers which has substantially vertical sidewalls.

2. The semiconductor processing method of forming a conductive interconnect line of claim 1 wherein the conductive layer comprises a silicide.

3. The semiconductor processing method of forming a conductive interconnect line of claim 1 wherein the second chemistry comprises $NH_4OH$ and a peroxide.

4. A semiconductor processing method of forming a pair of SRAM local interconnect lines comprising:

providing a semiconductive substrate having at least two SRAM components between which electrical communication is desired, the at least two SRAM components comprising four MOSFETs;

positioning the semiconductive substrate within a chamber of a physical vapor deposition reactor, the reactor having an inductive coil received within the chamber in which the semiconductive substrate is positioned, the chamber including a titanium target opposite which the semiconductive substrate is received, the inductive coil being received intermediate the target and substrate proximate a radial periphery of the chamber;

injecting a sputtering gas and a nitrogen containing source gas to within the chamber while generating a sputtering magnetron plasma proximate the titanium target and a gas plasma with the inductive coil proximate the semiconductive substrate, the magnetron and gas plasmas collectively extending entirely between at least a portion of the target and a portion of the semiconductive substrate, the inductive coil being powered at from about 1 kw to about 6 kw and the substrate being at less than 450° C. during at least some of the injecting effective to deposit a TiN comprising layer having at least 99% <200> crystal grain orientation purity;

removing the semiconductive substrate from the chamber and depositing a conductive layer over the TiN comprising layer having at least 99% <200> crystal grain orientation purity;

first anisotropically etching the conductive layer into first and second interconnect line shapes using a first etching chemistry; and second anisotropically etching the TiN comprising layer having at least 99% <200> crystal grain orientation purity into the first and second interconnect line shapes using a second chemistry different from the first to produce first and second interconnect lines of both the conductive and TiN comprising layers, one of the first and second interconnect lines connecting the gate of one MOSFET to a diffusion region of another MOSFET, the other of the first and second interconnect lines connecting a diffusion region of the one MOSFET to the gate of the another MOSFET, the first and second interconnect lines having substantially vertical sidewalls of both the conductive and TiN comprising layers.

* * * * *